(12) United States Patent
He et al.

(10) Patent No.: US 11,773,865 B2
(45) Date of Patent: Oct. 3, 2023

(54) HUB DRIVEN VARIABLE HEIGHT FAN

(71) Applicant: Dell Products L.P., Round Rock, TX (US)

(72) Inventors: Qinghong He, Austin, TX (US); Jay Zill, Round Rock, TX (US); Ken Nicholas, Leander, TX (US)

(73) Assignee: Dell Products L.P., Round Rock, TX (US)

( * ) Notice: Subject to any disclaimer, the term of this patent is extended or adjusted under 35 U.S.C. 154(b) by 103 days.

(21) Appl. No.: 17/389,607

(22) Filed: Jul. 30, 2021

(65) Prior Publication Data

US 2023/0030793 A1 Feb. 2, 2023

(51) Int. Cl.
| | |
|---|---|
| *F04D 29/32* | (2006.01) |
| *H05K 7/20* | (2006.01) |
| *F04D 19/00* | (2006.01) |
| *F04D 29/36* | (2006.01) |
| *F04D 27/00* | (2006.01) |
| *F04D 29/42* | (2006.01) |

(52) U.S. Cl.
CPC ......... *F04D 29/329* (2013.01); *F04D 19/002* (2013.01); *F04D 27/002* (2013.01); *F04D 29/362* (2013.01); *F04D 29/4226* (2013.01); *H05K 7/20172* (2013.01)

(58) Field of Classification Search
None
See application file for complete search history.

(56) References Cited

U.S. PATENT DOCUMENTS

| | | | |
|---|---|---|---|
| 9,410,557 B2 * | 8/2016 | Kuo | F04D 29/34 |
| 11,333,155 B2 * | 5/2022 | Huang | F04D 25/08 |
| 11,480,190 B2 * | 10/2022 | Tsai | F04D 29/626 |
| 2014/0098481 A1 | 4/2014 | Hartman et al. | |
| 2014/0193242 A1 * | 7/2014 | Kuo | F04D 29/282 |
| | | | 415/129 |
| 2017/0102746 A1 | 4/2017 | Knepper et al. | |
| 2020/0004303 A1 * | 1/2020 | Lin | F04D 17/16 |
| 2020/0309138 A1 * | 10/2020 | Tsai | F04D 17/10 |

* cited by examiner

*Primary Examiner* — Juan G Flores
(74) *Attorney, Agent, or Firm* — Larson Newman, LLP (57) ABSTRACT

A variable height fan of an information handling system includes a first fan having a first hub and a first plurality of fan blades. A second fan impeller includes a second hub and a second plurality of fan blades. The first hub slides along the second hub as the variable height fan transitions between an expanded position and a collapsed position. Interior edges of the first hub are in physical communication with exterior edges of the second hub, and the second fan impeller drives the first fan impeller through the physical communication between the interior edges of the first hub and the exterior edges of the second hub.

18 Claims, 4 Drawing Sheets

HUB DRIVEN VARIABLE HEIGHT FAN

FIELD OF THE DISCLOSURE

The present disclosure generally relates to hub driven variable height fan in an information handling system.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A variable height fan of an information handling system includes a first fan impeller having a first hub and a first plurality of fan blades. A second fan impeller includes a second hub and a second plurality of fan blades. The first hub may slide along the second hub as the variable height fan transitions between an expanded position and a collapsed position. Interior edges of the first hub are in physical communication with exterior edges of the second hub, and the second fan impeller may drive the first fan impeller through the physical communication between the interior edges of the first hub and the exterior edges of the second hub.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
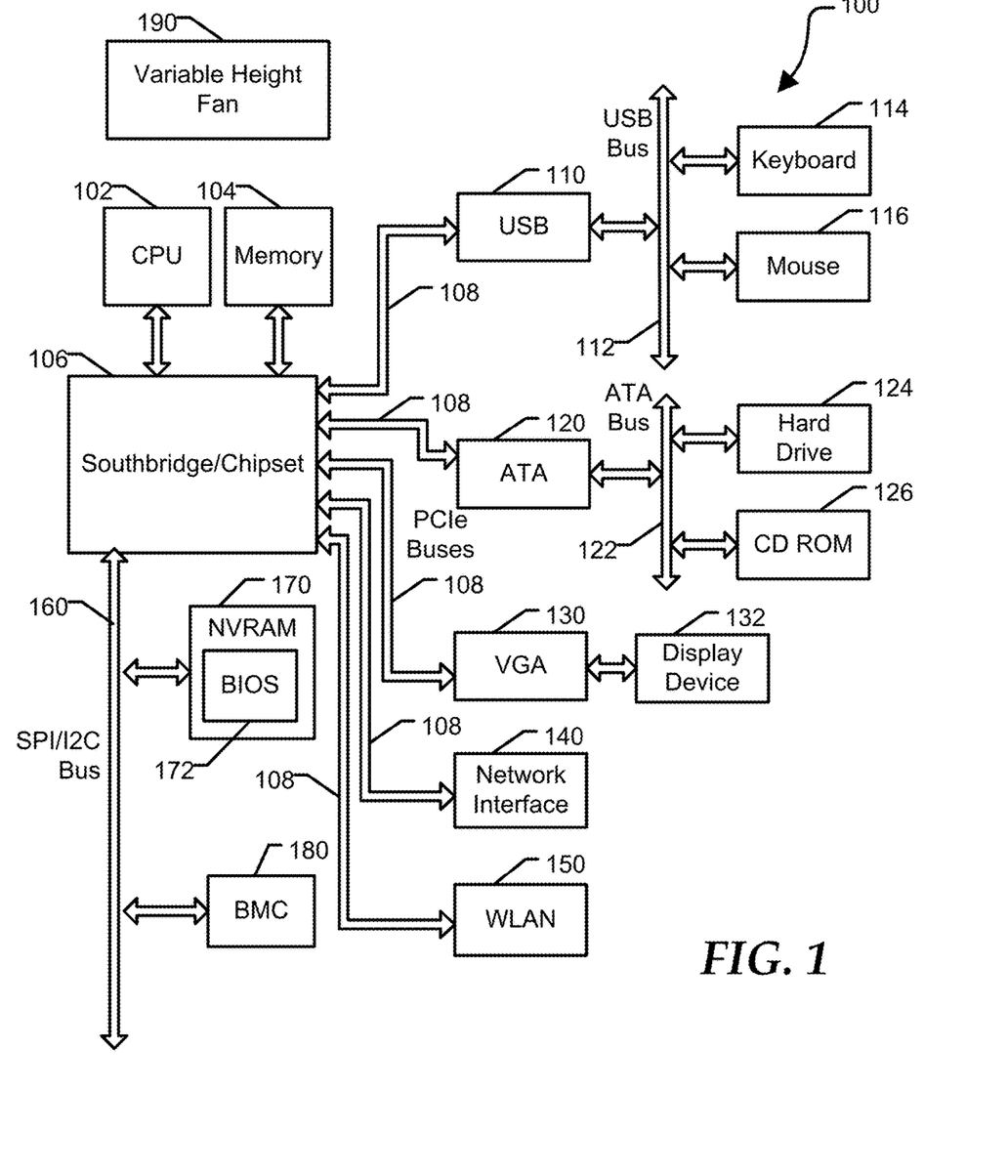
FIG. 1 is a block diagram of a general information handling system according to an embodiment of the present disclosure.

FIG. 1 illustrates a general information handling system 100. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various other I/O devices, such as a keyboard, a mouse, and a video display. The information handling system may also include one or more busses operable to transmit communications between the various hardware components.

Information handling system 100 including a processor 102, a memory 104, a southbridge/chipset 106, one or more PCIe buses 108, a universal serial bus (USB) controller 110, a USB 112, a keyboard device controller 114, a mouse device controller 116, a configuration an ATA bus controller 120, an ATA bus 122, a hard drive device controller 124, a compact disk read only memory (CD ROM) device controller 126, a video graphics array (VGA) device controller 130, a network interface controller (NIC) 140, a wireless local area network (WLAN) controller 150, a serial peripheral interface (SPI) bus 160, a NVRAM 170 for storing BIOS 172, and a baseboard management controller (BMC) 180. In an example, chipset 106 may be directly connected to an individual end point via a PCIe root port within the chipset and a point-to-point topology as shown in FIG. 1. BMC 180 can be referred to as a service processor or embedded controller (EC). Capabilities and functions provided by BMC 180 can vary considerably based on the type of information handling system. For example, the term baseboard management system is often used to describe an embedded processor included at a server, while an embedded controller is more likely to be found in a consumer-level device. As disclosed herein, BMC 180 represents a processing device different from CPU 102, which provides various management functions for information handling system 100. For example, an embedded controller may be responsible for power management, cooling management, and the like. An embedded controller included at a data storage system can be referred to as a storage enclosure processor.

System 100 can include additional processors that are configured to provide localized or specific control functions, such as a battery management controller. Bus 160 can include one or more busses, including a SPI bus, an I2C bus, a system management bus (SMBUS), a power management bus (PMBUS), and the like. BMC 180 can be configured to provide out-of-band access to devices at information handling system 100. As used herein, out-of-band access herein refers to operations performed prior to execution of BIOS 172 by processor 102 to initialize operation of system 100.

BIOS 172 can be referred to as a firmware image, and the term BIOS is herein used interchangeably with the term firmware image, or simply firmware. BIOS 172 includes instructions executable by CPU 102 to initialize and test the hardware components of system 100, and to load a boot loader or an operating system (OS) from a mass storage device. BIOS 172 additionally provides an abstraction layer for the hardware, such as a consistent way for application programs and operating systems to interact with the keyboard, display, and other input/output devices. When power is first applied to information handling system 100, the system begins a sequence of initialization procedures. During the initialization sequence, also referred to as a boot sequence, components of system 100 are configured and enabled for operation, and device drivers can be installed. Device drivers provide an interface through which other components of the system 100 can communicate with a corresponding device.

Information handling system 100 also includes a variable height fan 190. In an example, variable height fan 190 may provide cooling airflow to components of information handling system 100 including, but not limited to, CPU 102 and memory 104. Variable height fan 190 may automatically adjust in height based on a force exerted against a frame of the variable height fan as will be described with respect to FIGS. 2 and 3. In an example, the variations in height may enable fan blades within variable height fan 190 to continue to rotate or spin even if a force is exerted on a housing of the variable height fan as will be described below.

Information handling system 100 can include additional components and additional busses, not shown for clarity. For example, system 100 can include multiple processor cores, audio devices, and the like. While a particular arrangement of bus technologies and interconnections is illustrated for the purpose of example, one of skill will appreciate that the techniques disclosed herein are applicable to other system architectures. System 100 can include multiple CPUs and redundant bus controllers. One or more components can be integrated together. For example, portions of southbridge/chipset 106 can be integrated within CPU 102. Additional components of information handling system 100 can include one or more storage devices that can store machine-executable code, one or more communications ports for communicating with external devices, and various input and output (I/O) devices, such as a keyboard, a mouse, and a video display. An example of information handling system 100 includes a multi-tenant chassis system where groups of tenants (users) share a common chassis, and each of the tenants has a unique set of resources assigned to them. The resources can include blade servers of the chassis, input/output (I/O) modules, Peripheral Component Interconnect-Express (PCIe) cards, storage controllers, and the like.

Information handling system 100 can include a set of instructions that can be executed to cause the information handling system to perform any one or more of the methods or computer based functions disclosed herein. The information handling system 100 may operate as a standalone device or may be connected to other computer systems or peripheral devices, such as by a network.

In a networked deployment, the information handling system 100 may operate in the capacity of a server or as a client user computer in a server-client user network environment, or as a peer computer system in a peer-to-peer (or distributed) network environment. The information handling system 100 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 100 can be implemented using electronic devices that provide voice, video or data communication. Further, while a single information handling system 100 is illustrated, the term "system" shall also be taken to include any collection of systems or sub-systems that individually or jointly execute a set, or multiple sets, of instructions to perform one or more computer functions.

The information handling system 100 can include a disk drive unit and may include a computer-readable medium, not shown in FIG. 1, in which one or more sets of instructions, such as software, can be embedded. Further, the instructions may embody one or more of the methods or logic as described herein. In a particular embodiment, the instructions may reside completely, or at least partially, within system memory 104 or another memory included at system 100, and/or within the processor 102 during execution by the information handling system 100. The system memory 104 and the processor 102 also may include computer-readable media.

Figure 2:
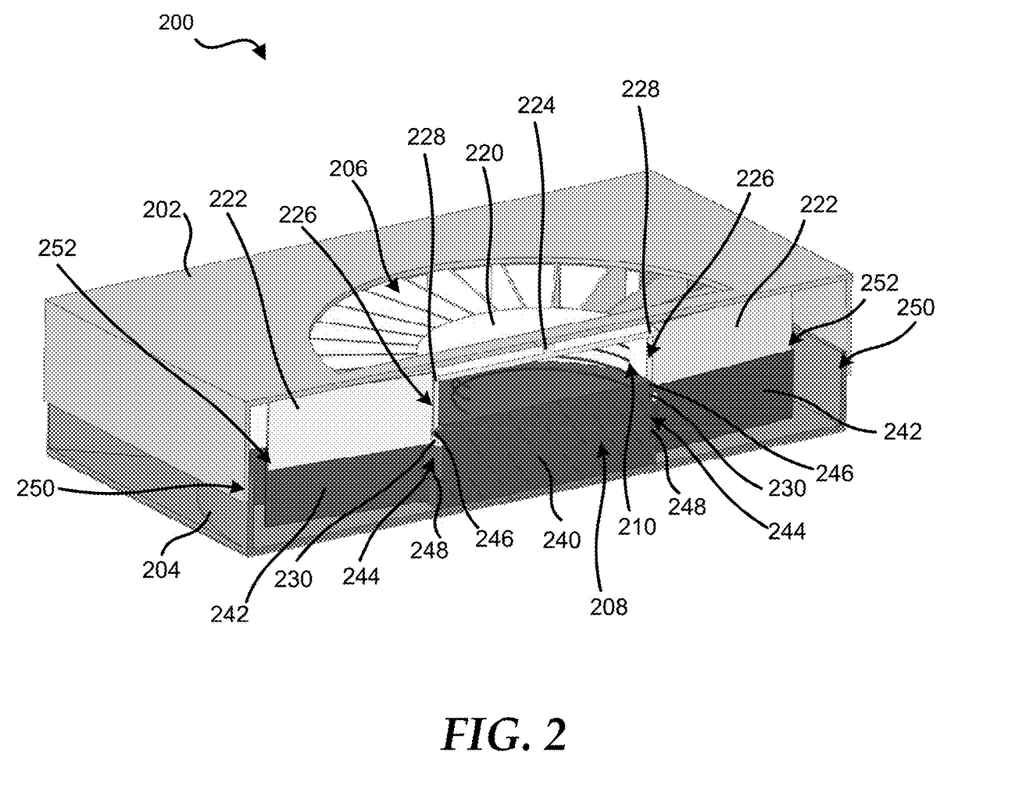
FIG. 2 is a cut-out view of a variable height fan in a first position according to at least one embodiment of the present disclosure.
Figure 3:
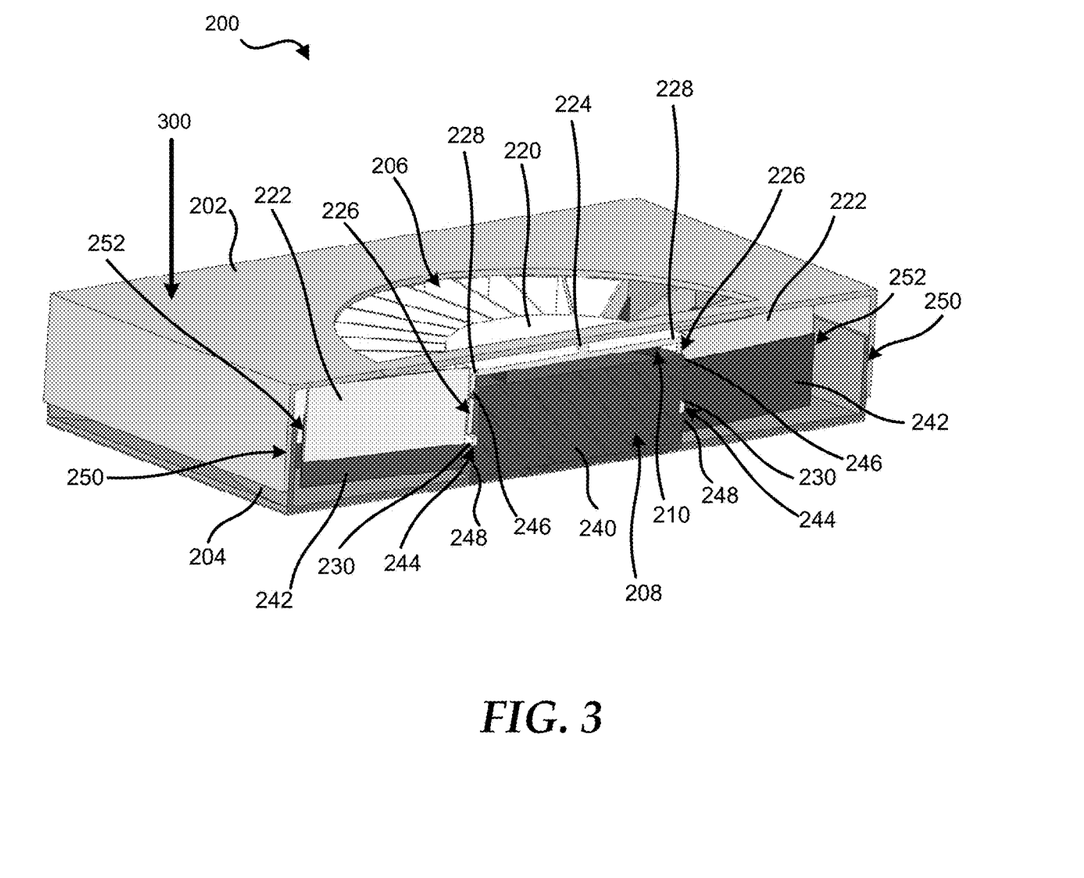
FIG. 3 is a cut-out view of a variable height fan in a second position according to at least one embodiment of the present disclosure.

FIGS. 2 and 3 illustrate a variable height fan 200 in a first position according to at least one embodiment of the present disclosure. Variable height fan 200 may be substantially the same as variable height fan 190 of FIG. 1. Variable height fan 200 may be placed within any information handling system or component of an information handling system, such as CPU 102 and memory 104 of information handling system 100 of FIG. 1, or any other system that may be cooled by the operation of the variable height fan. The present specification describes the use of variable height fan 200 within a laptop-type information handling system as described herein. In this embodiment, the variable height fan 200 includes a top housing 202 and a bottom housing 204 to house variable height fan 200 within a chassis of the laptop-type information handling system.

In the embodiment shown in FIG. 2, top housing 202 may slidably couple to bottom housing 204 such that the top housing may move relative to the bottom housing allowing a dynamic change in height. Top housing 202 may move relative to bottom housing 204 when, for example, a force is applied to the top housing when a D-cover (or, alternatively, a C-cover), depending on the orientation of variable height fan 200 in the information handling system, is deformed into the variable height fan. In an example, top housing 202 may be coupled to a portion of the D-cover (or, alternatively, a C-cover) of an information handling system, such as information handling system 100 of FIG. 1, with bottom housing 204 being mechanically coupled to an interior portion of the base chassis of the information handling system or to the C-cover as described herein. In the embodiments described herein, the "bottom" of the variable height fan 200 may be closest to the D-cover. As such, the D-cover may serve as an air inlet for air to enter variable height fan 200.

In certain examples, the D-cover may include holes or slats formed as one inlet vent into a D-cover inlet vent that allow the air to pass through the D-cover inlet vent, into variable height fan 200 and throughout the information handling system. The base chassis may have other vents placed elsewhere such as at the sides or back of the base chassis. Because the D-cover at the D-cover inlet vent is structurally weak, the D-cover may be relatively more deformable at the D-cover inlet vent in some aspects. When a force is applied to the D-cover inlet vent either purposefully or accidentally, the D-cover may be prevented from damaging variable height fan 200 as a result of the dual sets of fan blades 206 and 208 and the arrangement of hubs 220 and 240 as described herein.

In another example, the D-cover may be a C-cover of the information handling system. In this embodiment, the C-cover may include holes or slats (not shown) formed as one inlet vent into a C-cover inlet vent that allow the air to pass through the C-cover inlet vent, into variable height fan 200 and throughout the information handling system. The base chassis may have other vents placed elsewhere such as at the sides or back of the base chassis. Because the C-cover at the C-cover inlet vent is structurally weak, the C-cover may be relatively more deformable at the C-cover inlet vent in some aspects. When a force is applied to the C-cover inlet vent either purposefully or accidentally, the C-cover may be prevented from damaging variable height fan 200 as a result of the dual sets of fan blades 206 and 208 and the arrangement of hubs 220 and 240 as described herein.

Variable height fan 200 includes top housing 202, bottom housing 204, an upper fan impeller 206, a bottom fan impeller 208, and a spring 210. Upper fan impeller 206 includes a hub 220, multiple blades 222, a point of contact 224, channels 226, and channel stops 228 and 230. Bottom fan impeller 208 includes a hub 240, multiple blades 242, channels 244, and channel stops 246 and 248. In an example, variable height fan 200 may include additional components without varying from the scope of this disclosure.

In an example, point of contact 224 of upper fan impeller 206 may be placed in physical communication with top housing 202. In this example, point of contact 224 may push upper fan impeller 206 down when D-cover is pushed down on top housing 202. The movement of upper fan impeller 206 in relation to movement of top housing 202 and the D-cover enables upper and lower fan impellers 206 and 208 to continue to rotate without the blades 222 of the upper fan impeller hitting the upper housing. In previous information handling systems, an air gap is included between the fan impeller and D-cover to prevent the D-cover from interfering with the fan impeller. The air gap of previous information handling systems may reduce the thickness of the fan impeller. Variable height fan 200 may enable an overall impeller height, such as the combination of upper impeller 206 and bottom impeller 207, to be larger as compared to previous fans. In an example, the thermal performance of a fan from airflow may increase proportionally to the increase in impeller height.

In an example, bottom fan impeller 208 may be driven by an electrical motor in any suitable manner. The operation of an electrical motor driving bottom fan impeller 208 may be substantially similar to existing fans and will not be described herein. Hub 240 is in physical communication with hub 220, such that the hub of bottom impeller 208 may transfer the rotational force to upper impeller 206 via the hub of the upper impeller. Hubs 220 and 240 may be shaped to control the interface between bottom impeller 208 and upper impeller 206 as will be described with respect to FIGS. 4 and 5.

Figure 4:
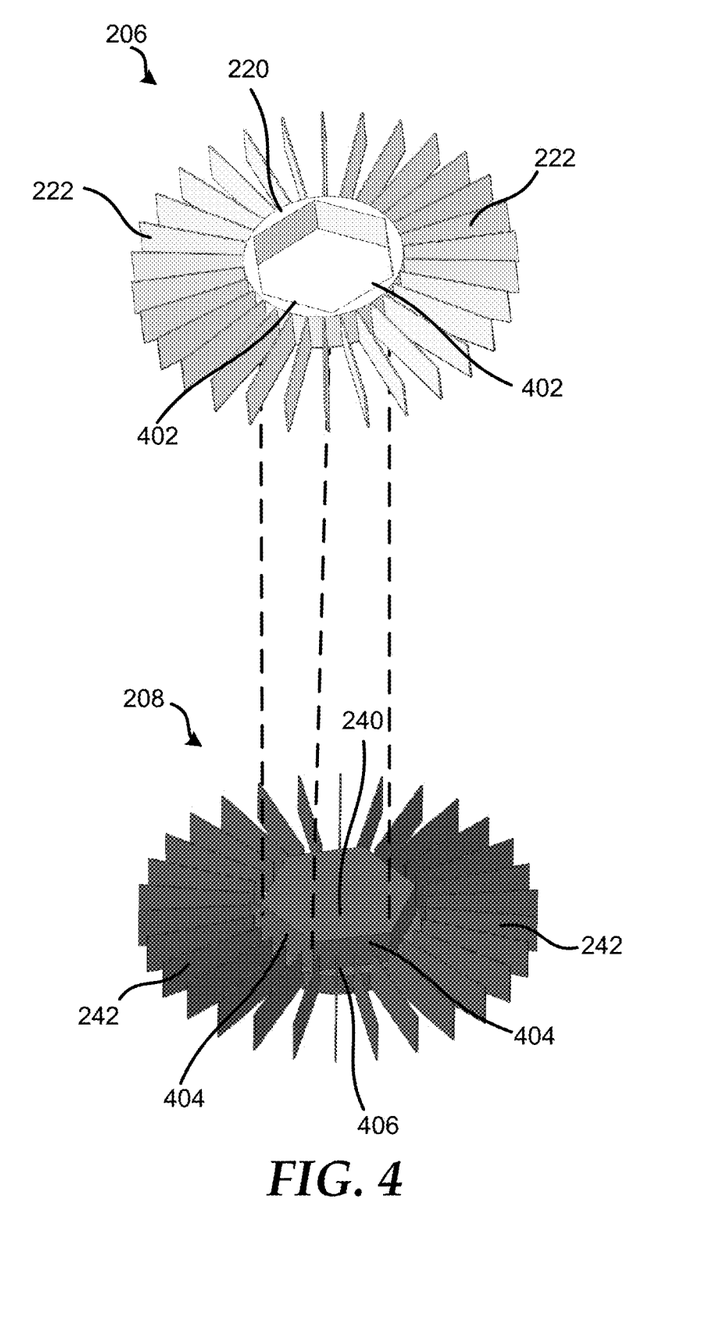
FIG. 4 is a perspective view of a top impeller aligned above a bottom impeller for the variable height fan according to at least one embodiment of the present disclosure.

FIG. 4 illustrates upper fan impeller 206 aligned above bottom fan impeller 208 according to at least one embodiment of the present disclosure. Upper fan impeller 206 includes hub 220 and fan blades 222. Hub 220 includes interior edges 402. Bottom fan impeller 208 includes hub 240 and fan blades 242. Hub 240 includes exterior edges 404 and a ledge 406. In FIG. 4, a top surface of hub 220 has been removed to clearly illustrate edges 402 of the hub.

In an example, interior edges 402 may form a cavity within hub 220, and exterior edges 404 form a corresponding shape in hub 240. to mate with hub 240 of bottom impeller 208. In certain examples, the cavity formed by interior edges 402 of hub 220 may be substantially the same shape as the shape formed by exterior edges 404 of hub 240. The same shape between interior edges 402 and exterior edges 404 may enable interior surfaces of hub 220 to slide up and down along exterior surfaces of hub 240.

Fan blades 222 of upper fan impeller 206 may slide along fan blades 242 of bottom fan impeller 208. In an example, all of fan blades 222 may be in physical communication with the same surface of corresponding fan blades 242. In this situation, a rotational force of fan blades 242 may be transferred to fan blades 222 to cause upper fan impeller 206 to rotate with a similar speed as bottom impeller fan 208.

In an example, additional contact points or mating surfaces between top impeller 206 and bottom impeller 208 may be created in any suitable manner. For example, the cavity formed by interior edges 402 may be any suitable polygon and the shape formed by exterior edges 404 may be the same as the shape of the cavity so that one edge 402 of top impeller 206 may be placed in physical contact with a corresponding edge of bottom impeller 208. In an example, the additional points of contact between bottom impeller 208 and upper impeller 206 may drive upper impeller 206 to rotate at substantially the same speed as bottom impeller 208.

Referring back to FIGS. 2 and 3, variable height fan 200 may transition between an expanded position, shown in FIG. 2, and a collapsed position, shown in FIG. 3, in any suitable manner. For example, spring 210 may be located or positioned between a top surface of hub 240 and a bottom surface of the top of hub 220. In an example, spring 210 may bias variable height fan 200 in the expanded position. For example, spring 210 may exert a force on top fan impeller 206, which may bias the top fan impeller away from bottom fan impeller 208. Spring 210 may push top impeller 206 against top housing 202 at point of contact 224. Based on the force from point of contact 224, top housing 202 may slide along bottom housing 204, which in turn may include one or more components to prevent top housing from extended beyond a top edge of the bottom housing.

In an example, channel 226 and stops 228 and 230 may interface with channel 244 and stops 246 and 248 to limit and control the distance hub 220 may slide up and down along hub 240. For example, when variable height fan 200 is in the expanded position, as shown in FIG. 2, stop 230 of top fan impeller 206 may slide along channel 244 until stop 230 is placed in physical communication with stop 246 of bottom fan impeller 208. The physical communication between stops 230 and 246 may limit the travel distance of top impeller 206 along bottom fan impeller 208 in the expanding direction of variable height fan 200. While stops 230 and 236 are in physical communication and the travel of upper fan impeller 206 is stopped, bottom edges of fan blades 222 may be located below top edges of fan blades 242, and a bottom portion of hub 220 is below a top portion of hub 240. In this situation, while variable height fan 200 is in the extended position, hub 240 may drive hub 220 and fan blades 242 may drive fan blades 222 and cause top fan impeller 206 to rotate.

Referring now to FIG. 3, a force may be exerted on top housing 202 in the direction of arrow 300 via any suitable means. For example, a D-cover of an information handling system may be pressed into top housing 202, which in turn may exert a force on top impeller 206 via contact point 224. In certain examples, as force in direction of arrow 300 increases an amount the D-cover may deform or bend may increase up to a maximum amount and the maximum amount may vary depending on a material of D-cover. In an example, based on the force in direction of arrow 300, top housing 202 may slide along bottom housing 204 and hub 220 of top fan impeller 206 may slide along hub 240 of bottom fan impeller 208.

In this example, the force in direction 300 may cause top fan impeller 206 to compress spring 210 and to transition variable height fan 200 from the expanded position to the compressed position. During the transition from the expanded position to the closed position, stop 230 of hub 206 may slide along channel 244 and stop 246 of hub 240 may slide along channel 226. In an example, a position or location of stop 248 on hub 240 may be set so that stop 230 is placed in physical communication with stop 248 when hub 220 has traveled along hub 240 a distance or length substantially equal to a maximum amount that D-cover may deform or bend. At this location, fan blades 222 may not extend below a bottom surface of fan blades 242 such that upper and bottom fan impellers 206 and 208 do not contact bottom housing 204. In an example, a maximum travel distance of top fan impeller 206 may also be controller by ledge 406 of hub 240, shown in FIG. 4. In this example, a bottom surface of hub 220 may be placed in physical communication with ledge 406, which in turn may prevent top fan impeller 206 from traveling any further along bottom fan impeller 208.

As described herein, variable height fan 200 may transition between an expanded position and a collapsed position based on forces exerted on top housing 202. Upper and bottom fan impellers 206 and 208 may avoid interference from top housing 202 and bottom housing 204 while variable height fan 200 is both in the expanded position and the collapsed position. Spring 210 may bias variable height fan 200 toward the expanded position to enable a maximum amount of airflow to be produced by the variable height fan.

Referring back to FIG. 1, while the computer-readable medium 136 of information handling system 100 is shown in FIG. 1 to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system can be a personal computer, a consumer electronic device, a network server or storage device, a switch router, wireless router, or other network communication device, a network connected device (cellular telephone, tablet device, etc.), or any other suitable device, and can vary in size, shape, performance, price, and functionality.

The information handling system can include memory (volatile (e.g. random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system can include one or more storage devices, one or more communications ports for communicating with external devices, as well as, various input and output (I/O) devices, such as a keyboard, a mouse, a video/graphic display, or any combination thereof. The information handling system can also include one or more buses operable to transmit communications between the various hardware components. Portions of an information handling system may themselves be considered information handling systems.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a device, such as a Pentium class or PowerPC™ brand processor, or other such device, or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A variable height fan for an information handling system, the variable height fan comprising:
   a first fan impeller including a first hub and a first plurality of fan blades;
   a second fan impeller including a second hub and a second plurality of fan blades, the first hub to slide along the second hub as the variable height fan transitions between an expanded position and a collapsed position, wherein interior edges of the first hub are in physical communication with exterior edges of the second hub, and the second fan impeller to drive the first fan impeller through the physical communication between the interior edges of the first hub and the exterior edges of the second hub; and
   a spring located between the first hub and the second hub, the spring to bias the first fan impeller away from the second fan impeller, and to bias the variable height fan toward the expanded position.

2. The variable height fan of claim 1, further comprising:
   a first housing in physical communication with the first fan impeller; and
   a second housing in physical communication with the second fan impeller and with the first housing, the first housing to slide along the second housing as the variable height fan transitions between the expanded position and the collapsed position.

3. The variable height fan of claim 2, wherein the first fan impeller further comprises:
   a connection point in physical communication with the first housing, wherein the connection point sets a distance between the first fan impeller and the first housing.

4. The variable height fan of claim 1, wherein the second hub to drive the first hub to cause the first impeller to rotate at substantially the same speed as the second impeller.

5. The variable height fan of claim 1, wherein each of the first fan blades is in physical communication with a corresponding one of the second fan blades, wherein the second fan blades drive the first fan blades to cause the first impeller to rotate at substantially the same speed as the second impeller.

6. The variable height fan of claim 1, wherein the interior edges of the first hub form a first polygon shape, and the exterior edges of the second hub form the first polygon shape.

7. The variable height fan of claim 1, wherein each of the first fan blades overlaps a corresponding one of the second fan blades when the variable height fan is both in the collapsed position and the expanded position.

8. An information handling system comprising:
   a processor; and
   a variable height fan to provide an airflow across the processor, the variable height fan including:
      a first fan impeller including a first hub and a first plurality of fan blades; and
      a second fan impeller including a second hub and a second plurality of fan blades, the first hub to slide along the second hub as the variable height fan transitions between an expanded position and a collapsed position, wherein interior edges of the first hub are in physical communication with exterior edges of the second hub, and the second fan impeller to drive the first fan impeller through the physical communication between the interior edges of the first hub and the exterior edges of the second hub, wherein the interior edges of the first hub form a first polygon shape, and the exterior edges of the second hub form the first polygon shape.

9. The information handling system of claim 8, wherein the variable height fan further comprises:
   a first housing in physical communication with the first fan impeller; and
   a second housing in physical communication with the second fan impeller and with the first housing, the first housing to slide along the second housing as the variable height fan transitions between the expanded position and the collapsed position.

10. The information handling system of claim 9, wherein the variable height fan further comprises:
    a connection point in physical communication with the first housing, wherein the connection point sets a distance between the first fan impeller and the first housing.

11. The information handling system of claim 8, wherein the variable height fan further comprises:
    a spring located between the first hub and the second hub, the spring to bias the first fan impeller away from the second fan impeller, and to bias the variable height fan toward the expanded position.

12. The information handling system of claim 8, wherein the second hub to drive the first hub to cause the first impeller to rotate at substantially the same speed as the second impeller.

13. The information handling system of claim 8, wherein each of the first fan blades is in physical communication with a corresponding one of the second fan blades, wherein the second fan blades drive the first fan blades to cause the first impeller to rotate at substantially the same speed as the second impeller.

14. The information handling system of claim 8, wherein each of the first fan blades overlaps a corresponding one of the second fan blades when the variable height fan is both in the collapsed position and the expanded position.

15. A variable height fan of an information handling system, the variable height fan comprising:
    a first fan impeller including a first hub and a first plurality of fan blades;

a second fan impeller including a second hub and a second plurality of fan blades, the first hub to slide along the second hub as the variable height fan transitions between an expanded position and a collapsed position, wherein interior edges of the first hub are in physical communication with exterior edges of the second hub, and the second fan impeller to drive the first fan impeller through the physical communication between the interior edges of the first hub and the exterior edges of the second hub;

a first housing in physical communication with the first fan impeller;

a second housing in physical communication with the second fan impeller and with the first housing, the first housing to slide along the second housing as the variable height fan transitions between the expanded position and the collapsed position; and a spring located between the first hub and the second hub, the spring to bias the first fan impeller away from the second fan impeller, and to bias the variable height fan toward the expanded position.

16. The variable height fan of claim 15, wherein the first fan impeller further comprises:

a connection point in physical communication with the first housing, wherein the connection point sets a distance between the first fan impeller and the first housing.

17. The variable height fan of claim 15, wherein the second hub to drive the first hub to cause the first impeller to rotate at substantially the same speed as the second impeller.

18. The variable height fan of claim 15, wherein each of the first fan blades is in physical communication with a corresponding one of the second fan blades, wherein the second fan blades drive the first fan blades to cause the first impeller to rotate at substantially the same speed as the second impeller.

* * * * *